(12) United States Patent
Yang et al.

(10) Patent No.: US 7,612,602 B2
(45) Date of Patent: Nov. 3, 2009

(54) RESONANT GATE DRIVE CIRCUITS

(75) Inventors: Zhihua Yang, Kingston (CA); Yan-Fei Liu, Kingston (CA)

(73) Assignee: Queen's University at Kingston, Kingston, ON (CA)

( * ) Notice: Subject to any disclaimer, the term of this patent is extended or adjusted under 35 U.S.C. 154(b) by 344 days.

(21) Appl. No.: 11/045,055

(22) Filed: Jan. 31, 2005

(65) Prior Publication Data

US 2006/0170042 A1 Aug. 3, 2006

(51) Int. Cl.
H03K 17/74 (2006.01)
(52) U.S. Cl. .................. 327/494; 327/587
(58) Field of Classification Search .............. None
See application file for complete search history.

(56) References Cited

U.S. PATENT DOCUMENTS

| | | | |
|---|---|---|---|
| 4,677,346 A | 6/1987 | Roberts et al. | |
| 5,010,261 A | 4/1991 | Steigerwald | |
| 5,140,201 A | 8/1992 | Uenishi | |
| 5,179,512 A | 1/1993 | Fisher et al. | |
| 5,204,561 A * | 4/1993 | Rischmuller | 327/427 |
| 5,264,736 A | 11/1993 | Jacobson | |
| 5,434,522 A * | 7/1995 | Fikart et al. | 327/122 |
| 5,872,703 A * | 2/1999 | Williams et al. | 363/17 |
| 6,169,683 B1 | 1/2001 | Farrington | |
| 6,172,550 B1 * | 1/2001 | Gold et al. | 327/366 |
| 6,259,305 B1 * | 7/2001 | Pakriswamy | 327/424 |
| 6,275,092 B1 * | 8/2001 | Maggio et al. | 327/424 |
| 6,344,768 B1 * | 2/2002 | Daun-Lindberg et al. | 327/424 |
| 6,441,673 B1 | 8/2002 | Zhang | |
| 6,462,596 B1 * | 10/2002 | Varma | 327/218 |
| 6,545,514 B2 * | 4/2003 | Barrow | 327/110 |
| 6,650,169 B2 * | 11/2003 | Faye et al. | 327/404 |
| 6,813,110 B2 * | 11/2004 | Leighton et al. | 360/68 |
| 7,061,279 B1 * | 6/2006 | Leete | 327/65 |

OTHER PUBLICATIONS

Alou, P., et al., "A new driving scheme for synchonous rectifiers: single winding self-driven synchronous rectification." *IEEE Transactions on Power Electronics*, 16: 803-811 (2001);.

(Continued)

*Primary Examiner*—Lincoln Donovan
*Assistant Examiner*—Khareem E. Almo
(74) *Attorney, Agent, or Firm*—Dowell & Dowell, P.C.; Stephen J. Scribner

(57) ABSTRACT

A resonate gate drive circuit for driving at least one power switching devices recovers energy loss for charging and discharging the input capacitance of the power switching devices. The gate drive circuit charging and discharging the gate capacitor with a high level current, so the switching loss of the power switching devices can also be reduced. The gate drive circuit can clamp and keep the voltage across the gate capacitor to a certain level while the power switching devices turn on, and it can also clamp and keep the voltage across the gate capacitor to almost zero while the power switching devices turn off. The gate drive circuit comprises four small semiconductor bidirectional conducting switching devices connected in full-bridge configuration. An inductor is connected to the two junctions of the full-bridge configuration to help switching the current direction. A capacitor in series with the inductor is necessary for some applications. A bootstrap circuit, which is widely used in conventional gate drive circuitry, is also necessary for this resonant gate drive circuit when it is adopted for high-side and low-side applications.

46 Claims, 16 Drawing Sheets

OTHER PUBLICATIONS

Chen, Y., et al., "A resonant MOSFET gate driver with complete energy recovery," *IEEE Power Electronics and Motion Control Conference, Proceedings, The Third International*, 1: 402-406 (2000);.

Chen, Y., et al., "A resonant MOSFET gate driver with efficient energy recovery." *IEEE Transactions on Power Electronics*, 19: 470-477 (2004);.

Christoph, K.J., et al., "High frequency power MOSFET gate drive considerations." *HFPC Proceedings*, May pp. 173-180 (1988).

Cobos, J.A., et al., "New driving scheme for self driven sychronous rectifiers." *IEEE* pp. 840-846 (1999);.

de Vries, I.D., "A resonant power MOSFET/IGBT gate driver." *IEEE* pp. 197-185 (2002);.

Diaz, J., et al., "A new family of loss-less power MOSFET drivers." *IEEE* pp. 43-48 (1994);.

Diaz, J., et al., "A new lossless power MOSFET driver based on simple DC/DC converters." *IEEE*, pp. 37-43 (1995);.

Jacobson, B.S., et al., "High frequency resonant gate driver with partial energy recovery." *HFPC Proceedings*, May, pp. 133-141 (1993);.

Leedham, R.J., et al., "Design of a high speed poqer MOSFET driver and its use in a half-bridge converter." *The European Power Electronics Association*, pp. 407-412 (1993);.

López, T., et al., "A detailed analysis of a resonant gate driver for PWM applications." *IEEE* pp. 873-878 (2003);.

Maksimović, D., "A MOS gate drive with resonant transitions." *IEEE* pp. 527-532 (1991);.

Panov, Y., et al., "Design considerations for 12-V/1.5-V, 50-A voltage regulator modules." *IEEE Transactions on Power Electronics* 16: 776-783 (2001); correction to "Design considerations for 12-V/1.5-V, 50-A voltage regulator modules." *IEEE Transactions on Power Electronics* 17: 152 (2002);.

Strydom, J.T., "A comparison of fundamental gate-driver topologies for high frequency applications." *IEEE* pp. 1045-1052 (2004).

Weinberg, S.H., "A novel lossless resonant MOSFET driver." *IEEE* pp. 1003-1010 (1992);.

Wiegman, H.L.N., "A resonant pulse gate drive for high frequency applications." *IEEE* pp. 738-743 (1992);.

Yao, K., et al., "a novel resonant gate driver for high frequency synchronous buck converter." *IEEE* pp. 280-286 (2001);.

Yao, K., et al., "A novel resonant gate driver for high frequency synchronous buck converters." *IEEE Transactions on Power Electronics* 17: 180-186 (2002);.

* cited by examiner

RESONANT GATE DRIVE CIRCUITS

FIELD OF INVENTION

This invention relates to DC-DC and AC-DC switching converters. More particularly, it relates to an effective way to turn on and to turn off the MOSFET that is used in such converters.

BACKGROUND OF INVENTION AND PRIOR ART

The development of microprocessor and other integrated circuits introduces new challenges to the development of power converters. In order to reduce the passive component size, and also to meet the stringent transient response requirement, the switching frequency of the power converter will move into the MHz range in the next few years.

At high frequency and low power application, the effect of the gate-driver on the overall converter becomes more significant. As the operating frequency of power converters is raised, the losses associated with driving the power MOSFET rise, which is proportional to the switching frequency. At low power levels the resulting penalty on the overall converter efficiency become significant. On the other hand, as power MOSFET die are increased in size to improve the MOSFET on-resistance, the gate-source capacitance of the MOSFET increases in a proportional manner. Therefore, in low voltage, high current applications, the gate driving loss will also increase when the low on-resistance MOSFETs are chosen to reduce the conduction loss. The gate drive losses can often offset advantages gained by the lower conduction losses.

Hence, lossless gate drive circuits have attracted much attention in recent years. Resonant gate drivers are an efficient alternative to the conventional methods to drive power MOSFETs. Many approaches have already been proposed. Most of them are designed for one single MOSFET and based on L-C resonance techniques. Such as, "A MOS gate drive with resonant transitions," IEEE PESC'91, pp. 527-532, proposed by D. Maksimovic, "A resonant MOSFET gate driver with efficient energy recovery," IEEE transaction on power electronics, Vol. 19, No. 2, March 2004, pp. 470-477, proposed by Y. Chen, F. C. Lee, L. Amoroso, H. Wu, "A resonant power MOSFET/IGBT gate driver," IEEE, APEC'02, pp. 179-185, proposed by I. D. de Vries. A simple DC-DC converter and a transformer are even adopted in some solutions, like "A new lossless power MOSFET driver based on simple DC/DC converters," IEEE PESC'95, pp. 37-43, proposed by J. Diaz, M. A. Perez, F. M. Linera, F. Aldana, which makes the gate driver too complicated and the energy that can be recovered is also limited. All the above solutions can only recover limited gate driving loss and have no other benefits.

In a synchronous buck converter, the switching loss of the top MOSFET is another restriction which limits the switching frequency can't go up further, as the switching loss is also proportion to the switching frequency.

A resonant gate driver for two MOSFETs in a synchronous buck converter is also proposed by K. Yao and F. C. Lee in "A novel resonant gate driver for high frequency synchronous buck converters," IEEE Transaction on power electronics, Vol. 17, No. 2, March 2003, pp. 180-186, but the required control signals are difficult to generate, and the coupled inductor is expensive and hard to design. This solution does not reduce the switching loss of the top MOSFET.

di/dt is another serious issue if the switching frequency is to be increased. The MOSFETs may be falsely triggered if the gate driver cannot clamp, or lock, the gate-source voltage of the MOSFET at less than its threshold while the MOSFET should turn off.

The proposed resonant gate drive circuits of the present invention can solve all the above issues. It can reduce the gate driver energy substantially, it can reduce the switching loss of the top MOSFET in synchronous buck converter, and it can also eliminate di/dt problem. It includes several kinds of configuration, so it can be widely used.

OBJECT OF INVENTION

One object of the invention is to provide a resonant gate drive system to reduce the gate drive loss and other losses for power switching devices having an input capacitor.

Another object of the invention is to provide one resonant gate drive circuit that can drive two separate power switching devices with symmetrical signals to reduce the gate drive loss and conduction loss for the power switching devices.

Another object of the invention is to provide one resonant gate drive circuit that can drive two separate power switching devices with complimentary signal to reduce the gate drive loss and conduction loss for the power switching devices.

Another object of the invention is to provide one resonant gate drive circuit that can drive one low side and one high side power switching devices with complimentary or symmetrical signal to reduce gate drive loss, switching loss and conduction loss.

BRIEF STATEMENT OF INVENTION

By one aspect of this invention there is provided a method of controlling operation of at least one power switching device having a gate capacitor, comprising the steps of:

charging the gate capacitor of the power switching device at a high current level;

connecting the gate capacitor of the power switching device to a voltage source, via a low impedance path, while the power switching device is on;

discharging the gate capacitor of power switching device at a high current level;

and maintaining the gate capacitor of the power switching device at a low voltage via said low impedance path while the power switching device is off;

so as to recover the energy loss for charging and discharging the gate capacitor of the power switching devices and to reduce the switching loss of the power switching device.

By another aspect of this invention there is provided a resonant gate drive circuit comprising a current switching circuit, including a voltage source, connected to an alternating current source; and at least two capacitors connected to said switching circuit so as to connect said current source to said capacitors and to charge and discharge said capacitors at selected time instants.

BRIEF DESCRIPTION OF DRAWINGS

For better understanding of the present invention and to show more clearly how it may be carried into effect, references will be made, by way of example, to the accompanying drawings which show the preferred embodiment of the present invention and in which.

DETAILED DESCRIPTION OF PREFERRED EMBODIMENT

This invention proposes a new resonant gate drive scheme that can control a power switching device having a gate capacitor, such as a MOSFET (Metal Oxide Semiconductor Field Effect Transistor), IGBT (Gate Insulate Bipolar Transistor), or MCT (MOS Controlled Thyristor), etc. For ease of description of this specification, MOSFET will be used as a non-limiting example for all such devices.

As compared with the conventional resonant gate drive scheme, the proposed resonant gate drive scheme can control two separate power switching devices. It can reduce not only the gate drive loss. It can also reduce the switching loss of these power switching devices.

Figure 1:
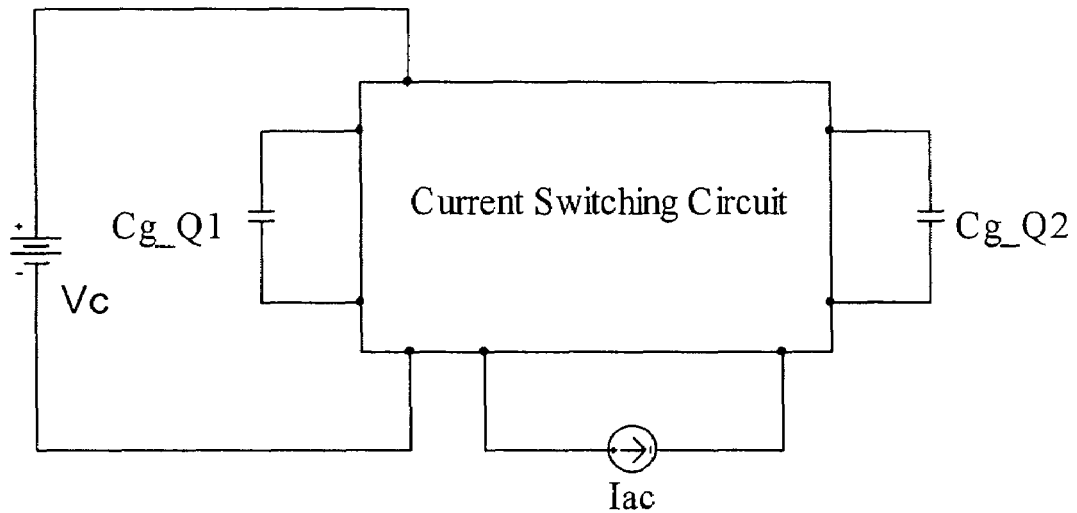
FIG. 1 is a general circuit diagram of the resonant gate drive circuit according to one embodiment of the present invention.

The circuit block diagram of the proposed scheme is shown in FIG. 1. In the figure, $Cg\_Q1$, $Cg\_Q2$ are capacitors that will be charged and discharged. Vc is a voltage source. Iac is an alternating current source. For half the switching period, its value is positive and for the other half of the switching period, its value is negative. Current Switching Circuit is used to direct the current source, Iac, to charge and discharge capacitors $Cg\_Q1$ and $Cg\_Q2$ at desired time instants. The operation of the current switch circuit is in such a way that the peak value, or close to the peak value of Iac, is used to charge and discharge the capacitor $Cg\_Q1$ and $Cg\_Q2$. The current switching circuit can also clamp the voltage across $Cg\_Q1$ and $Cg\_Q2$ at either around zero or around Vc. Two major advantages of this arrangement are: (1) the gate drive loss of the power switching device can be reduced; (2) $Cg\_Q1$ and $Cg\_Q2$ can be charged and discharged quickly and thus benefit the operation of the power switching device, such as MOSFET.

Figure 2:
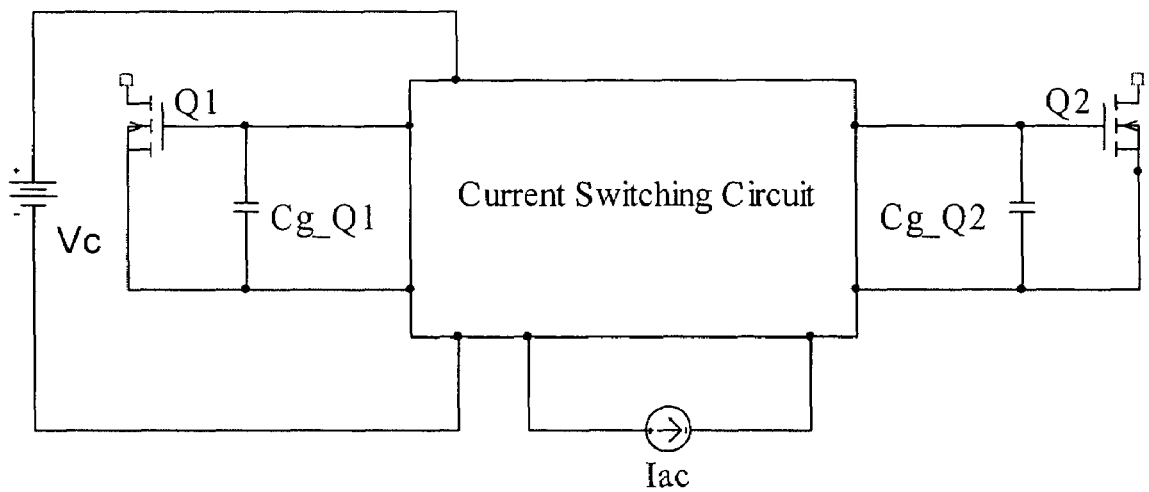
FIG. 2 is a general circuit diagram of the resonant gate drive circuit for two MOSFETs.

The circuit shown in FIG. 1 can be used to control two separate MOSFETs, as shown in FIG. 2. In this case, $Cg\_Q1$ and $Cg\_Q2$ can be the gate capacitor of MOSFETs. For example, $Cg\_Q1$ can be the gate capacitor of one MOSFET, Q1, and $Cg\_Q2$ can be the gate capacitor of another MOSFET, Q2. In some applications, Q1 and/or Q2 consist of two or more MOSFETs connected in parallel.

Figure 3:
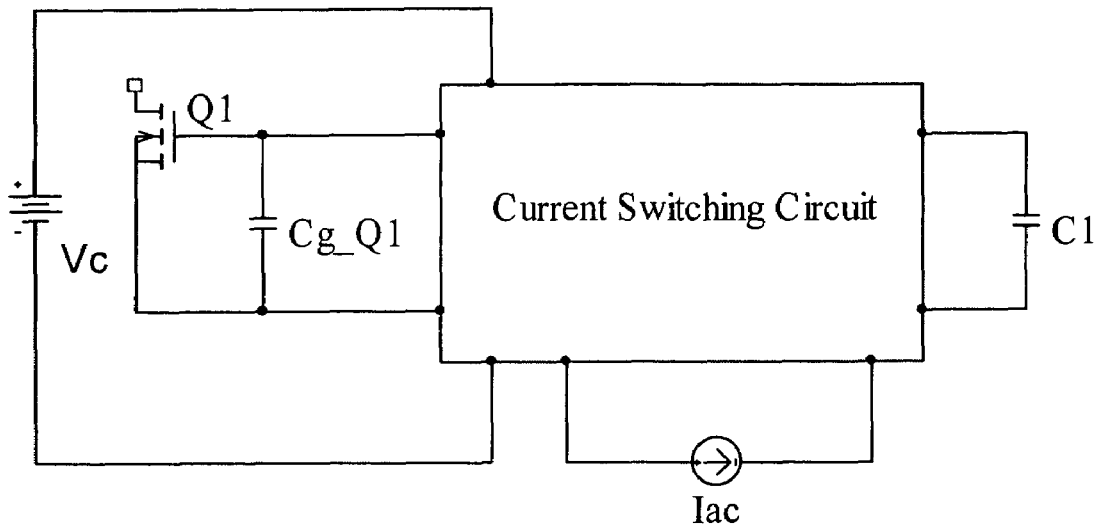
FIG. 3 is a general circuit diagram of the resonant gate drive circuit for one MOSFET.

The circuit shown in FIG. 1 can also be used to control one MOSFET, as shown in FIG. 3. In this case, $Cg\_Q1$ is the gate capacitor of MOSFET Q1. C1 is the added capacitor.

Three resonant gate drive circuits are proposed for different types of power converters to reduce the gate drive loss and to reduce the switching loss. The first circuit is for dual low side symmetrical MOSFET drive. The second circuit is for dual low side complimentary MOSFET drive. The third circuit is for dual high side and low side complimentary or symmetrical MOSFET drive. These circuits can be used to cover most of the switching converter topologies. The significant advantages of these circuits are reduced gate drive loss and reduced switching loss achieved by reducing switching time.

These three circuits, preferred implementation, and their operations are described in detail in the following three sections.

1 Dual Low Side Symmetrical Resonant Gate Drive Circuit

This section discusses in detail, with the circuit topology, the operations of the resonant gate drive circuit for a dual low side symmetrical MOSFET drive. For example, it can be used to drive synchronous rectifiers in a current doubler configuration. It can also be used to drive the primary MOSFET in both current fed push-pull converters and voltage-fed push pull converter. The circuit can also be used in other power converters as will be evident to one skilled in the art.

1.1 Topology

Figure 4:
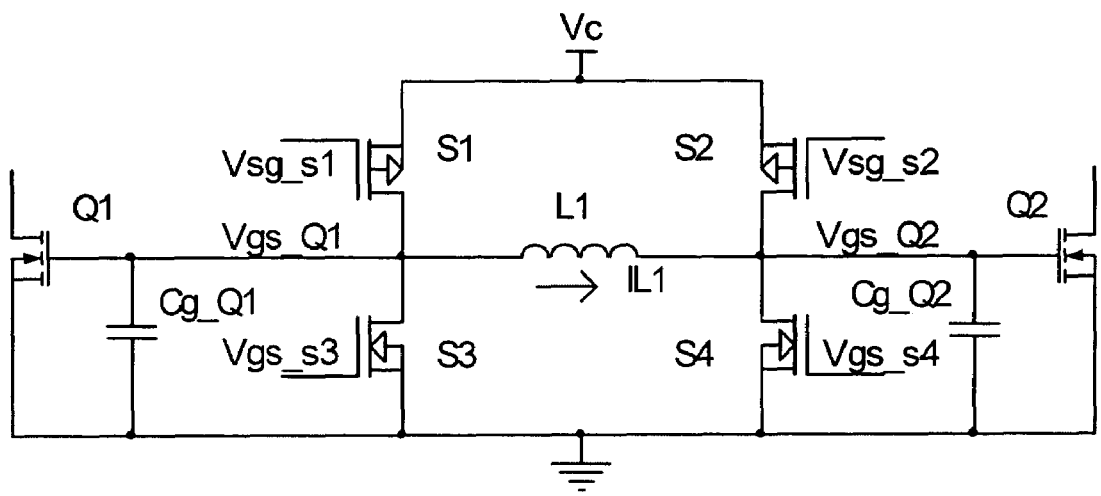
FIG. 4 is a general circuit diagram of a dual low side symmetrical resonant gate drive circuit.

The resonant gate drive circuit for dual low side symmetrical MOSFET drive is shown in FIG. 4.

The circuit consists of four switches, S1-S4, connecting as a bridge configuration, and one inductor, L1, connecting across the bridge. Capacitors, $Cg\_Q1$ and $Cg\_Q2$, are the load of the resonant gate drive circuit. Vc is the voltage source. In order to simplify the implementation, P-channel MOSFET is used for S1 and S2 and N-channel MOSFET is used for S3 and S4. It is noted that other implementation methods can also be used to achieve same objective.

One objective of the resonant gate drive circuit shown in FIG. 4 is to charge and discharge capacitors, $Cg\_Q1$ and $Cg\_Q2$, with minimum energy loss and as soon as possible. In real application, $Cg\_Q1$ and $Cg\_Q2$ are gate capacitors of MOSFETs. When the capacitor voltage is high, the MOSFET is turned on and when the capacitor voltage is low, the MOSFET is turned off. With this circuit, the duty cycles of the voltages across $Cg\_Q1$ and $Cg\_Q2$ are same. The duty cycle can be higher than 0.5, equal to 0.5 or lower than 0.5. The actual duty cycle will be decided by the gate drive signals for S1-S4. The duty cycle is defined as the ratio between the time when the MOSFET is on and the switching period, or D=Ton/Ts, where Ton is the MOSFET on time and Ts is switching period.

Figure 5:
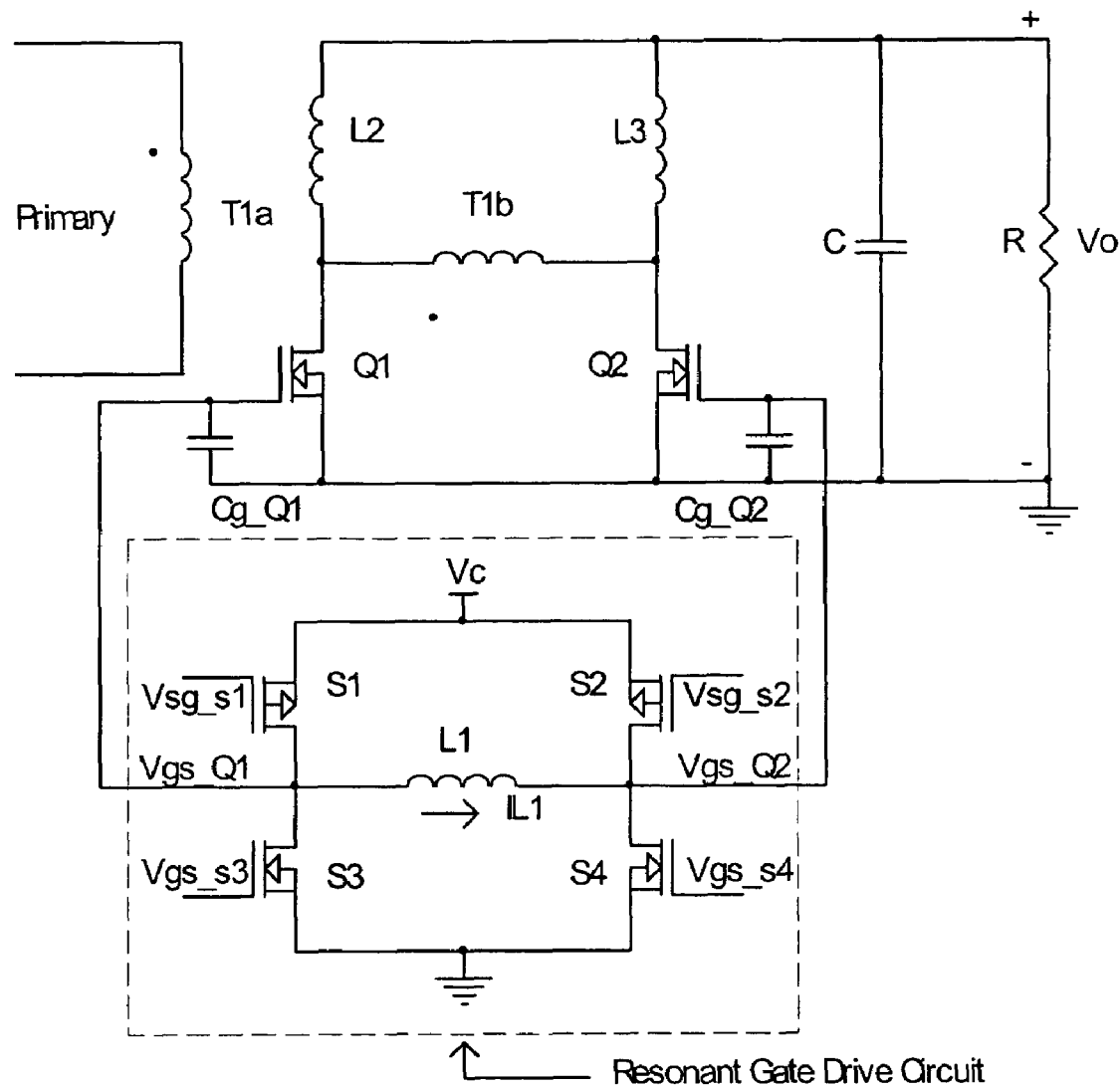
FIG. 5 is a circuit diagram of a current doubler with a dual low side symmetrical resonant gate drive circuit.

FIG. 5 shows the circuit when the dual low side symmetrical resonant gate drive circuit is used to drive the synchronous rectifiers used in a current doubler circuit. In the circuit, Q1 and Q2 are MOSFETs used as synchronous rectifier. Cg_Q1 and Cg_Q2 represent the gate capacitor of MOSFET Q1 and Q2, respectively. In this circuit, the duty cycles for Q1 and Q2 are same and the duty cycle is larger than 50%.

With the resonant gate drive circuit, the energy stored in the gate of Q1 and Q2 is recovered by the resonant gate drive circuit. In addition, the turn on and turn off time of Q1 and Q2 are also reduced, which will help reduce their conduction loss.

Figure 6:
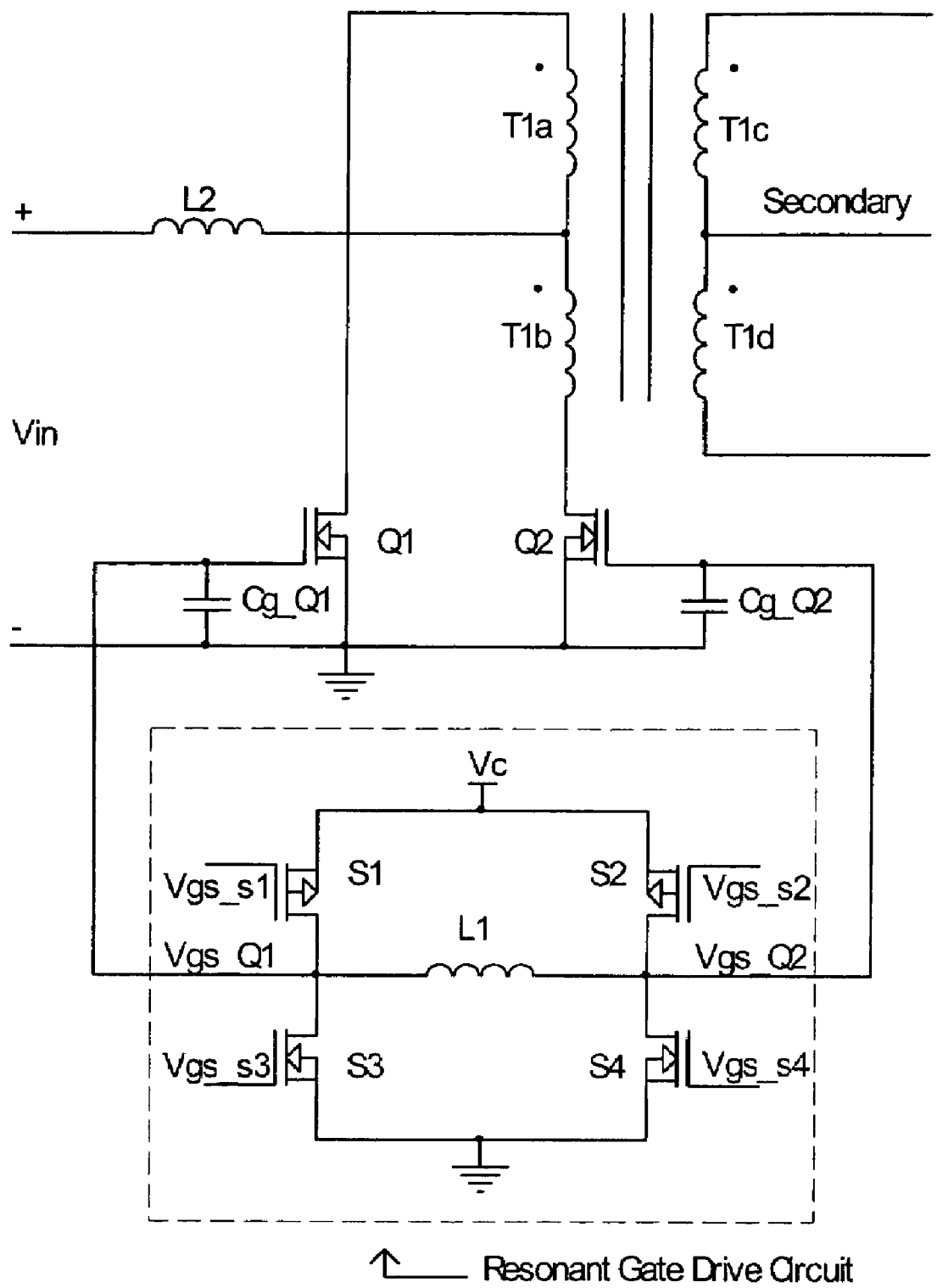
FIG. 6 is a circuit diagram of a current fed push-pull converter with a dual low side resonant gate drive circuit.

The resonant gate drive circuit can also be used in other switching power converters. FIG. 6 shows current fed push-pull converter with resonant gate drive circuit to drive the primary side MOSFET, Q1 and Q2. In this converter, the duty cycle for Q1 and Q2 is same and larger than 50%.

Figure 7:
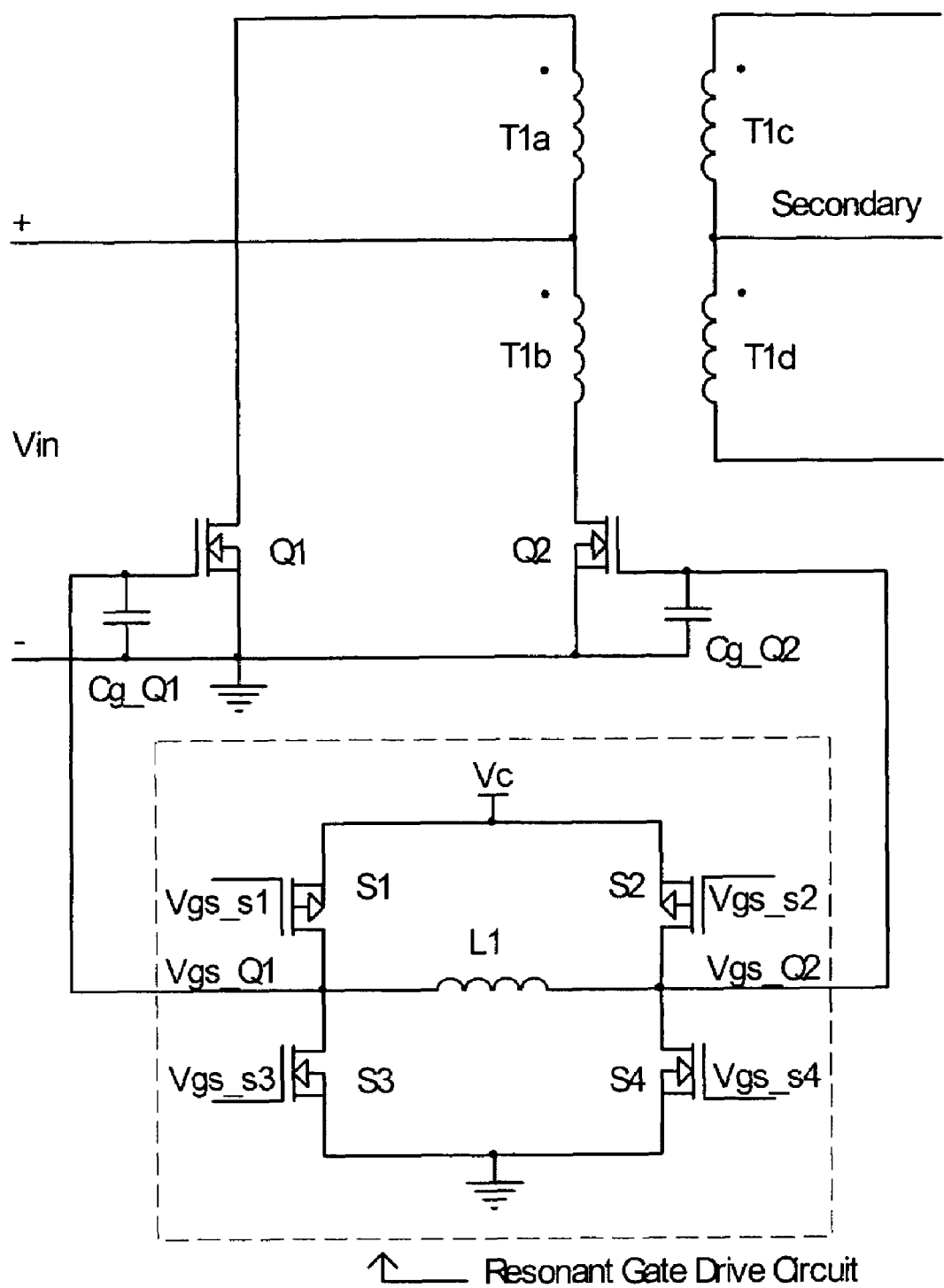
FIG. 7 is a circuit diagram of a voltage fed push-pull converter with a dual low side resonant gate drive circuit.

The resonant gate drive circuit shown in FIG. 4 can also be used for power converters when the duty cycle is less than 0.5. FIG. 7 shows voltage fed push-pull converter with resonant gate drive circuit. In this converter, the duty cycle for Q1 and Q2 is the same and less than 0.5.

With different gate drive signals to S1, S2, S3, and S4, the duty cycle for Q1 and Q2 can be changed from below 0.5, to 0.5 and to above 0.5. The following sections describe the operation of the resonant gate drive circuit, as shown in FIG. 4, under different duty cycle conditions.

1.2 Operation for D>0.5

Figure 8:
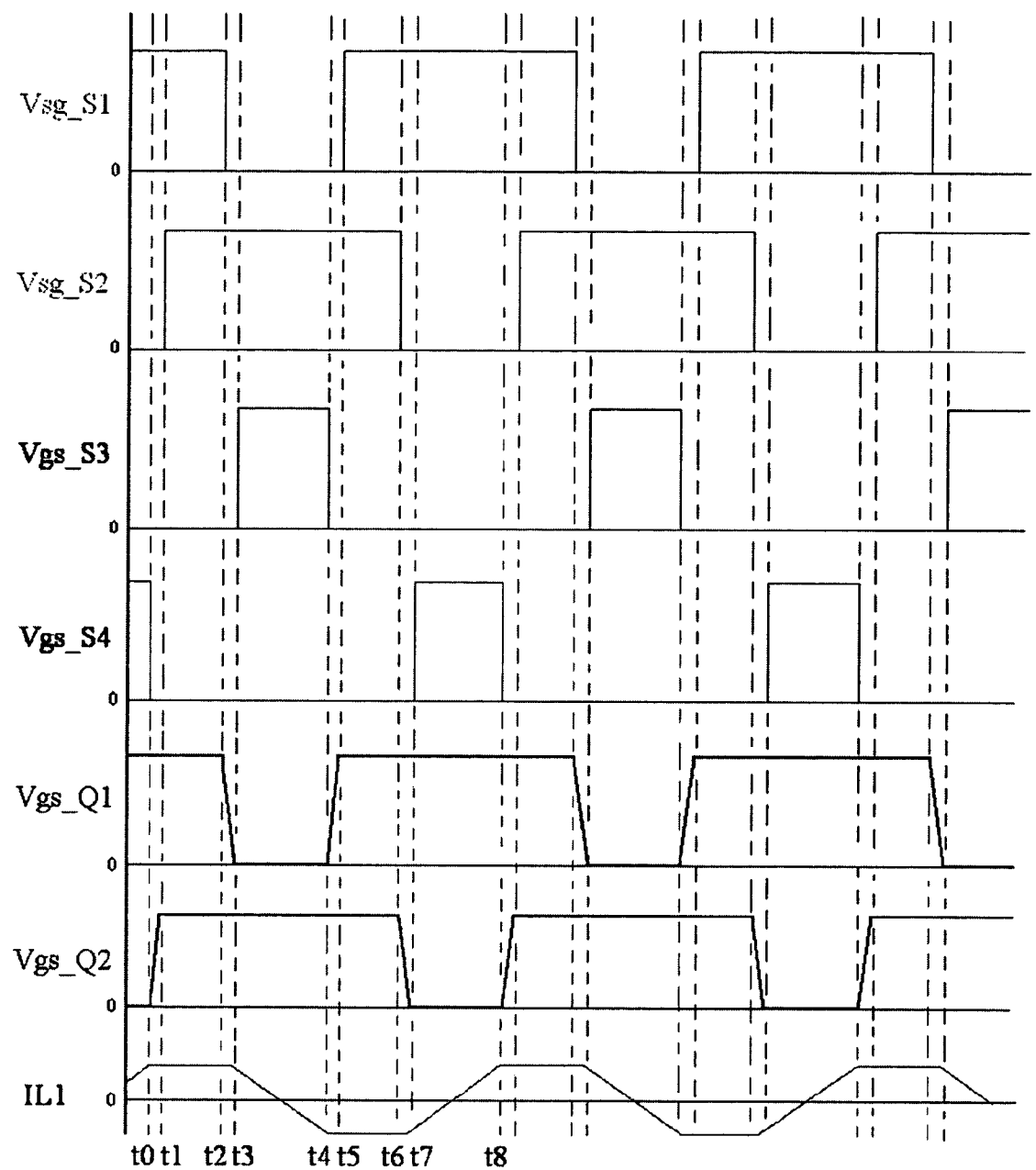
FIG. 8 shows the key waveforms for a dual low side symmetrical resonant gate drive circuit when D>0.5.

When duty cycle is larger than 0.5, the operation of the dual low side symmetrical resonant gate drive circuit, as shown in FIG. 4, can be analyzed by the key waveforms shown in FIG. 8. In the figure, Vsg_S1, Vsg_S2, Vgs_S3, and Vgs_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1.

The following provides the detailed operation of the dual low side symmetrical resonant gate drive circuit under D>0.5. Refer to the key waveforms in FIG. 8 and circuit in FIG. 5.

Before t0:
S1, S4 are on and S2, S3 are off. Q1 is on and Q2 is off. Inductor current IL1 increases to maximum value at t0.

From t0 to t1:
S4 is turned off at t0. Inductor L1 resonates with the gate capacitor of MOSFET Q2, Cg_Q2. Cg_Q2 will be charged at this period. The voltage across Cg_Q2 increases and it will be clamped to the source voltage, Vc, by the body diode of S2 before t1. Q2 is turned on in this time interval. At t1, S2 turns on with zero voltage. By controlling the turn off instant for S4 (t0), the turn on instant of Q2 can be controlled.

From t1 to t2:
S1, S2 are on and S3, S4 are off. Both Q1 and Q2 are on and inductor current IL1 is circulating through S1 and S2 and remains constant in this interval.

From t2 to t3:
S1 is turned off at t2 with zero voltage. Inductor L1 resonates with the gate capacitor of MOSFET Q1, Cg_Q1. Cg_Q1 will be discharged at this period. The voltage across Cg_Q1 decreases and it will be clamped to zero by the body diode of S3 before t3. Q1 is turned off in this time interval. At t3, S3 turns on with zero voltage. By controlling the turn off instant of S1 (t2), the turn off instant of Q1 can be controlled.

From t3 to t4:
S2, S3 are on and S1, S4 are off. Q1 is off and Q2 is on. The inductor current IL1 decreases to zero and it will increase in opposite direction. It reaches the negative maximum at t4.

From t4 to t5:
S3 is turned off at t4. Inductor L1 resonates with capacitor Cg_Q1. Cg_Q1 will be charged. The voltage across Cg_Q1 increases and it will be clamped to the source voltage Vc by the body diode of S1 before t5. Q1 is turned on in this time interval. At t5, S1 turns on with zero voltage. By controlling the turn off instant of S3 (t4), the turn on instant of Q1 can be controlled.

From t5 to t6:
S1, S2 are on and S3, S4 are off. Both Q1 and Q2 are on and inductor current IL1 is circulating through S1 and S2 and remains constant in this interval.

From t6 to t7:
S2 is turned off at t6 with zero voltage. Inductor L1 resonates with capacitor Cg_Q2. Cg_Q2 will be discharged at this period. The voltage across Cg_Q2 decreases and it will be clamped to zero by the body diode of S4 before t7. Q2 is turned off in this time interval. At t7, S4 turns on with zero voltage. By controlling the turn off instant for S2 (t6), the turn off instant of Q2 can be controlled.

From t7 to t8:
S1, S4 are on and S2, S3 are off. Q1 is on and Q2 is off. The negative inductor current rises through zero and then further increases. The value of the current IL1 will increase to positive maximum at t8. The next cycle will start at t8.

1.3 Operation for D=0.5

Figure 9:
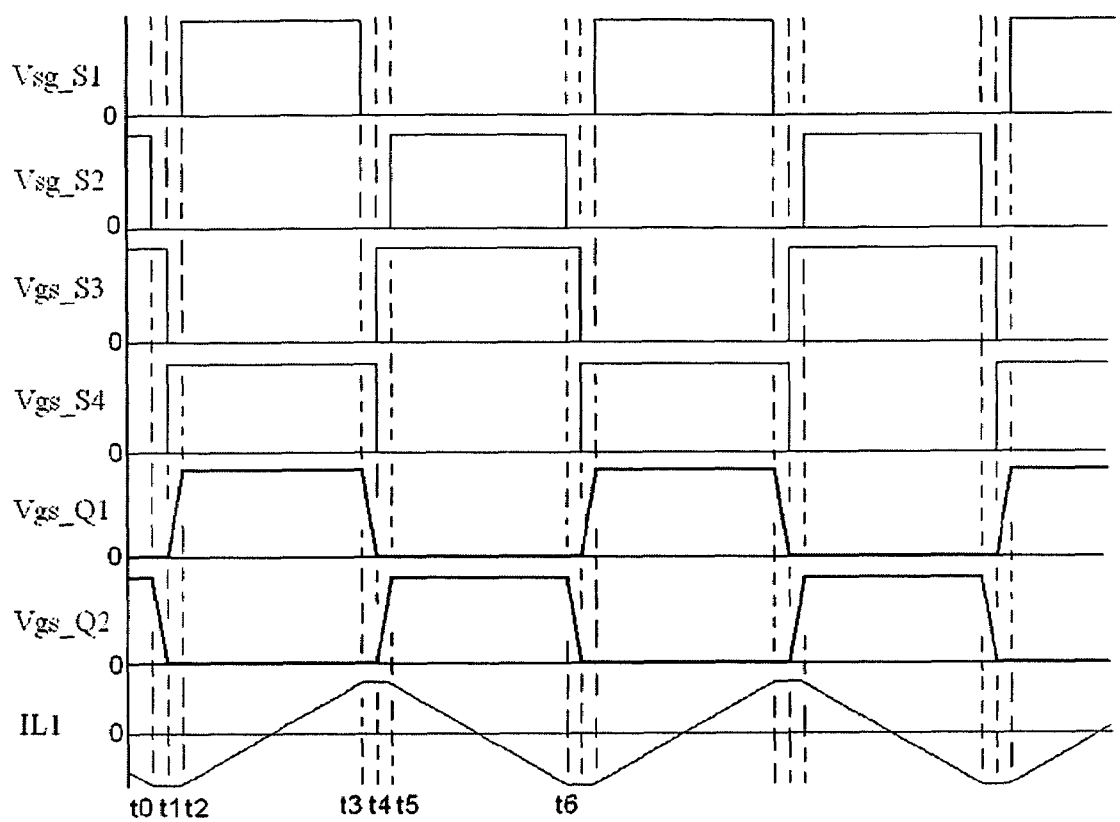
FIG. 9 shows the key waveforms for a dual low side symmetrical resonant gate drive circuit when D=0.5.

When the duty cycle equals 0.5, the operation of the dual low side symmetrical resonant gate drive circuit, as shown in FIG. 4 and FIG. 5, can be analyzed by the key waveforms shown in FIG. 9. The operation is similar to that for D>0.5 and is not explained here. In the figure, Vsg_S1, Vsg_S2, Vgs_S3, and Vgs_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1.

1.4 Operation for D<0.5

Figure 10:
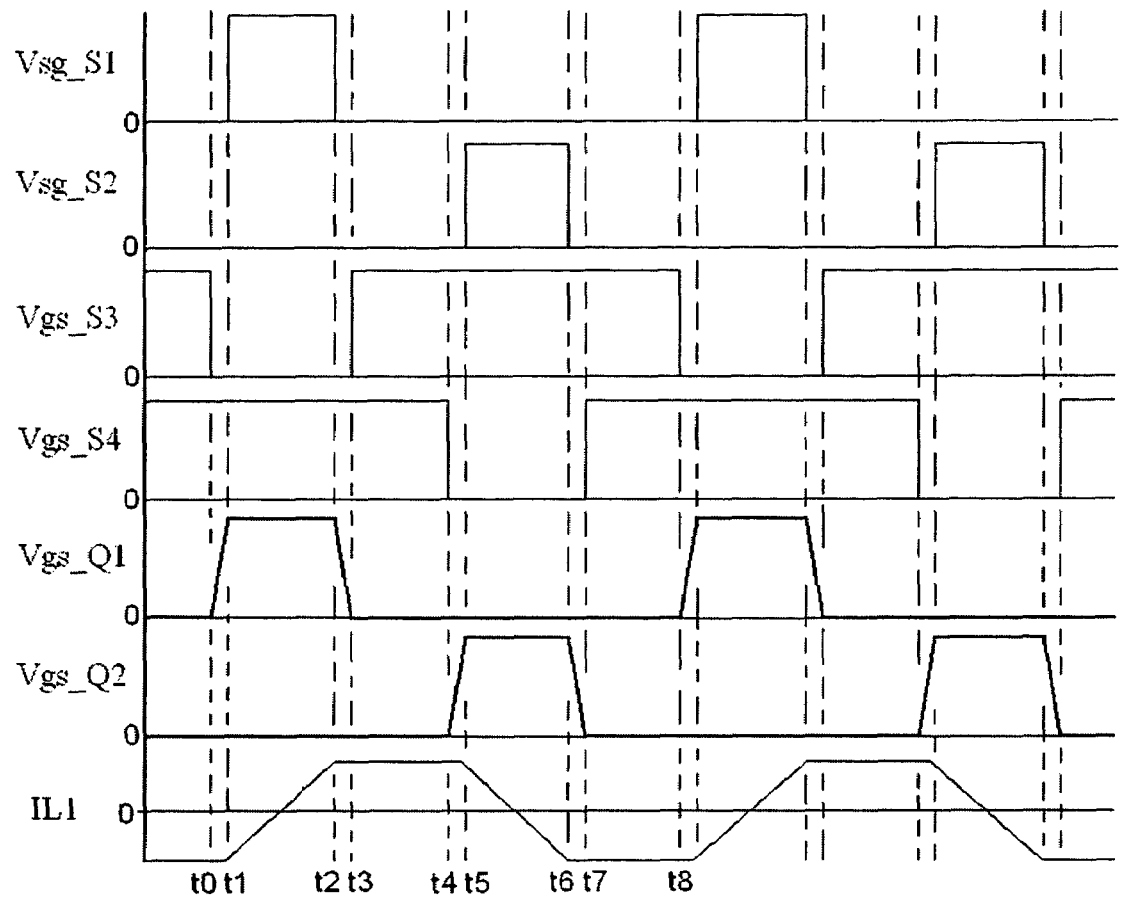
FIG. 10 shows the key waveforms for a dual low side symmetrical resonant gate drive circuit when D<0.5.

When the duty cycle is less than 0.5, the operation of the dual low side symmetrical resonant gate drive circuit, as shown in FIG. 4 and FIG. 5, can be analyzed by key waveforms shown in FIG. 10. The operation is similar to that for D>0.5 and is not explained here. In the figure, Vsg_S1, Vsg_S2, Vgs_S3, and Vgs_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1.

2 Dual Low Side Complementary Resonant Gate Drive Circuit

This section discusses the detailed circuit topology and operations of the resonant gate drive circuit for a dual low side complimentary MOSFET drive. For example, the circuit can be used to drive the synchronous rectifiers for Forward converter. The circuit can also be used for other power converters as will be evident to one skilled in the art.

2.1 Topology

Figure 11:
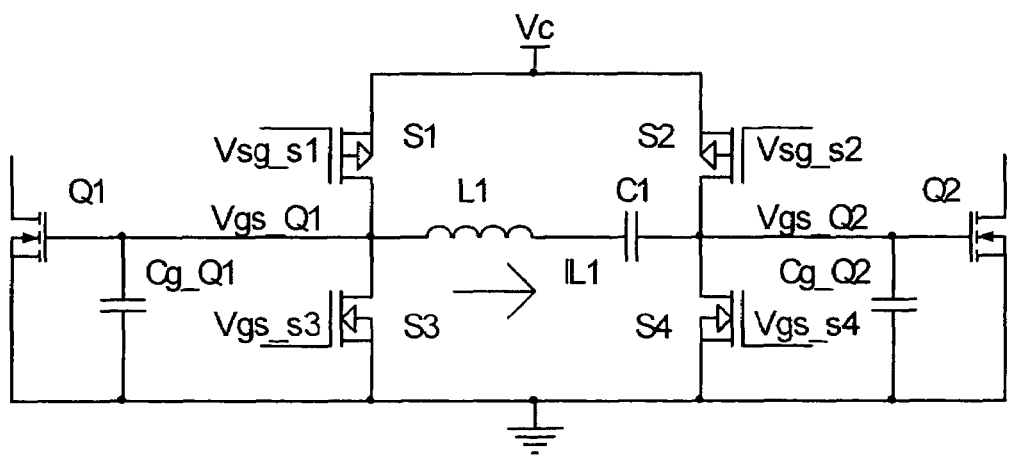
FIG. 11 is a circuit diagram of a dual low side complimentary resonant gate drive circuit.

The resonant gate drive circuit for dual low side complimentary MOSFET drive is shown in FIG. 11.

Similar to the dual low side symmetrical resonant gate drive circuit shown in FIG. 4, the circuit consists of four switches, S1-S4, connecting as a bridge configuration, and one inductor, L1, connecting across the bridge. Capacitor C1 is added in series with the inductor L1. This capacitor is used to block the DC current flowing through the inductor L1. Capacitors, Cg_Q1 and Cg_Q2, are the load of the resonant gate drive circuit. Vc is the voltage source.

One objective of the circuit shown in FIG. 11 is to charge and discharge capacitors, Cg_Q1 and Cg_Q2, with minimum energy loss and as soon as possible. In real application, Cg_Q1 and Cg_Q2 are gate capacitor of MOSFETs. With this circuit, the duty cycles of the voltage across Cg_Q1 and Cg_Q2 are complimentary. In other words, if the duty cycle for the voltage across Cg_Q1 is D, then the duty cycle for the voltage across Cg_Q2 is 1−D. In order to simplify the implementation, P-channel MOSFET is used for S1 and S2 and N-channel MOSFET is used for S3 and S4. It is noted that other implementation methods can also be used to achieve the same objective.

Figure 12:
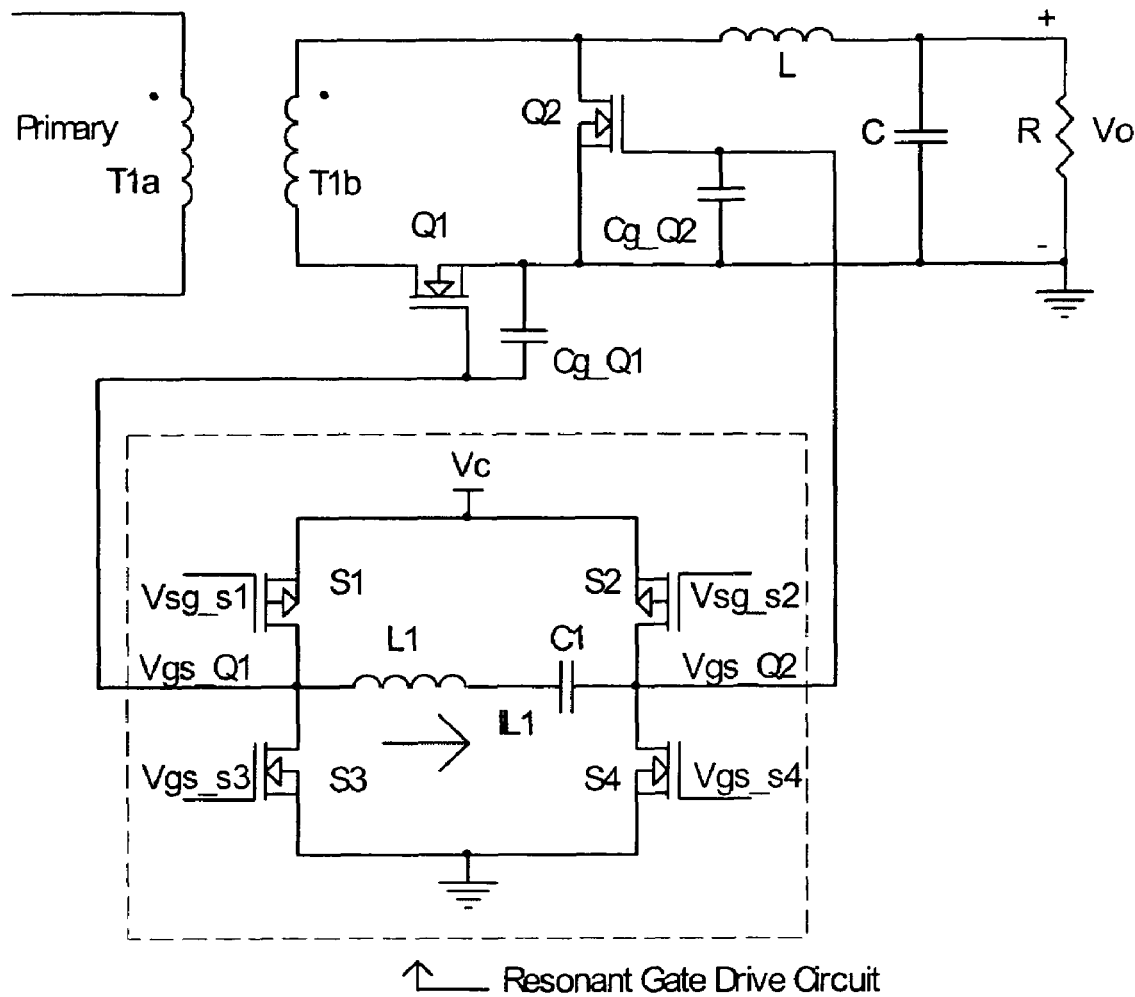
FIG. 12 is a circuit diagram of a forward converter with a dual low side complimentary resonant gate drive circuit.

FIG. 12 shows the circuit when the dual low side complimentary resonant gate drive circuit is used to drive the synchronous rectifiers used for a Forward converter. In the circuit, Q1 and Q2 are MOSFETs used as a synchronous rectifier. Cg_Q1 and Cg_Q2 represent the gate capacitor of MOSFET Q1 and Q2, respectively. In the circuit, the duty cycle for Q1 is D and the duty cycle for Q2 is 1−D.

With the resonant gate drive circuit, the energy stored in the gate of Q1 and Q2 is recovered by the resonant gate drive circuit. In addition, the turn on time and turn off time of Q1 and Q2 are also reduced, which will help reduce their conduction loss.

2.2 Operation

Figure 13:
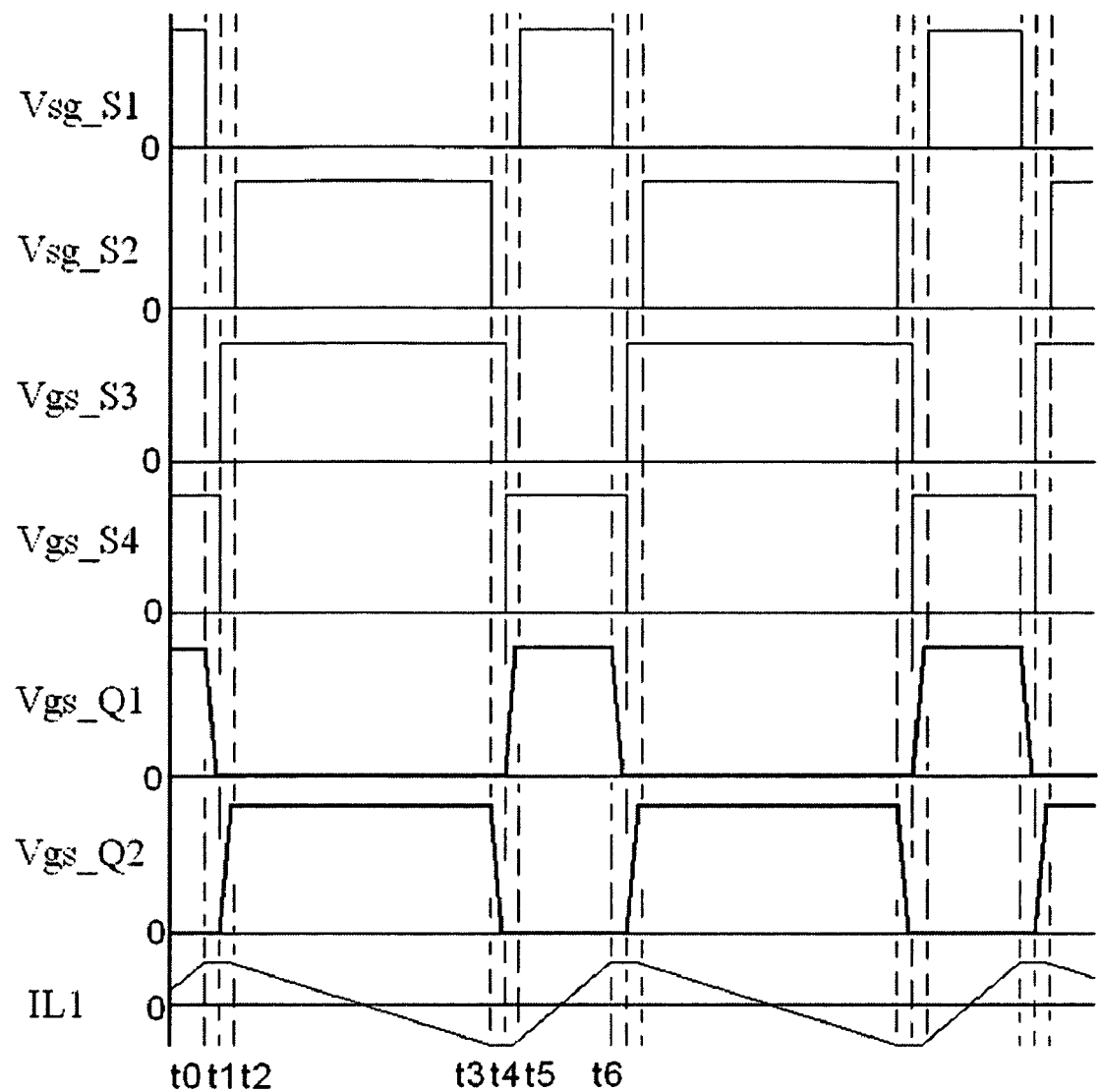
FIG. 13 shows the key waveforms of dual low side complimentary resonant gate drive circuit.

The operation of the dual low side complimentary resonant gate drive circuit, as shown in FIG. 11, can be analyzed by the key waveforms shown in FIG. 13. In the figure, Vsg_S1, Vsg_S2, Vgs_S3, and Vgs_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1. In the analysis, it is assumed that capacitor C1 is very large and the voltage across C1 is a DC value. If the capacitor value C1 is small, the operation of the circuit does not change.

The following provides the detailed operation of the dual low side complimentary resonant gate driver circuit. The duty cycle for Q1 is D and duty cycle for Q2 is 1−D. Refer to the key waveforms in FIG. 13 and the circuit in FIG. 12.

Before t0:

S1, S4 are on and S2, S3 are off. Q1 is on and Q2 is off. Inductor current IL1 increases to the maximum value at t0.

From t0 to t1:

S1 is turned off at t0. Inductor L1 resonates with the input capacitor of MOSFET Q1, Cg_Q1. Cg_Q1 will be discharged at this period. The voltage across Cg_Q1 decreases and it will be clamped to zero by the body diode of S3 before t1. Q1 is turned off in this time interval. At t1, S3 is turned on and S4 is turned off with zero voltage simultaneously. By controlling the turn off instant for S1 (t0), the turn off instant of Q1 can be controlled.

From t1 to t2:

S3 is turned on and S4 is turned off with zero voltage at t1 simultaneously. Inductor L1 resonates with the input capacitor of MOSFET Q2, Cg_Q2. Cg_Q2 will be charged at this period. The voltage across Cg_Q2 increases and it will be clamped to the source voltage Vc by the body diode of S2 before t2. Q2 is turned on in this time interval. At t2, S2 is turned on with zero voltage. By controlling the turn on instant for S3 (t1), the turn on instant for Q2 can be controlled.

From t2 to t3:

S1, S4 are off and S2, S3 are on. Q1 is off and Q2 is on. The inductor current IL1 decreases to zero and then it will increase in opposite direction. It reaches negative maximum at t3. At t3, S2 is turned off with zero voltage.

From t3 to t4:

S2 is turned off at t3. Inductor L1 resonates with capacitor Cg_Q2. Cg_Q2 will be discharged at this period. The voltage across Cg_Q2 decreases and it will be clamped to zero by the body diode of S4 before t4. Q2 is turned off in this time interval. At t4, S3 is turned off and S4 is turned on with zero voltage simultaneously. By controlling the turn off instant for S2 (t3), the turn off instant of Q2 can be controlled.

From t4 to t5:

S3 is turned off and S4 is turned on with zero voltage at t4 simultaneously. Inductor L1 resonates with capacitor Cg_Q1. Cg_Q1 will be charged at this period. The voltage across Cg_Q1 increases and it will be clamped to the source voltage Vc by the body diode of S1 before t5. Q1 is turned on in this time interval. At t5, S1 is turned on with zero voltage. By controlling the turn off instant for S3 (t4), the turn on instant for Q1 can be controlled.

From t5 to t6:

S1, S4 are on and S2, S3 are off, while Q1 is on and Q2 is off. The negative inductor current IL1 rises through zero and further increases. The value of the inductor current IL1 will increase to positive maximum at t6. The next cycle will start at t6.

3 Dual High Side and Low Side Resonant Gate Drive Circuit

This section discusses the detailed circuit topology and operations of the resonant gate drive circuit for dual low side and high side complimentary or symmetrical MOSFET drive. For example, the circuit can be used to drive the control MOSFET and synchronous MOSFET for Buck converter. The circuit can be used to drive the high side and low side MOSFET in the half bridge converter and full bridge converter. It can also be used for phase shift in a full bridge converter. The circuit can also be used for other power converters as will be evident to one skilled in the art.

3.1 Topology

Figure 14:
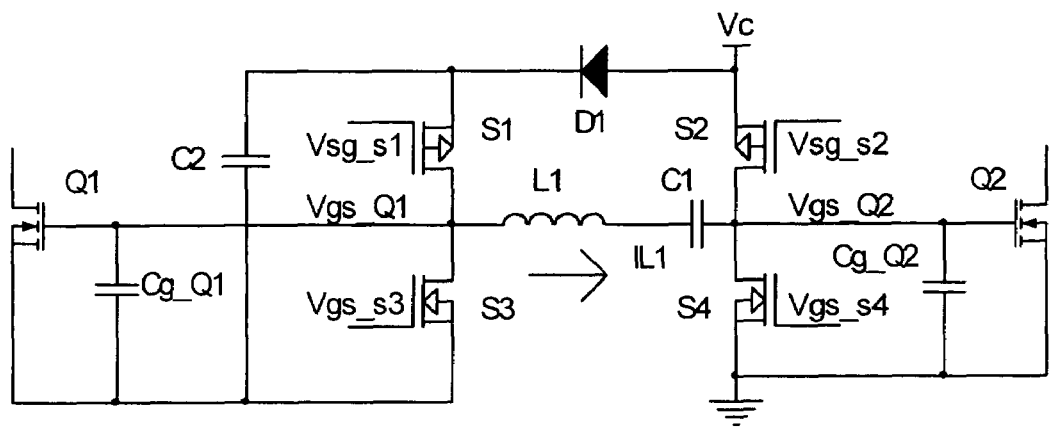
FIG. 14 is a circuit diagram of a dual high side and low side complimentary resonant gate drive circuit.

The resonant gate drive circuit for dual high side and low side complimentary MOSFET drive is shown in FIG. 14.

The circuit consists of four switches, S1-S4, one inductor, L1, two capacitors, C1 and C2, and one diode, D1. Capacitor C1 is used to block the DC current flow through inductor L1. Capacitor C2 is a flying capacitor that is used for high side drive. Diode D1 is used to charge the capacitor C2 to a voltage above the supply voltage Vc. Capacitors, Cg_Q1 and Cg_Q2, are the load of the resonant gate drive. It is noted that one end of Cg_Q2 is connected to ground. However, neither end of Cg_Q1 is connected to ground. This capacitor is floating. This is required for high side drive. In order to simplify the implementation, P-channel MOSFET is used for S1 and S2 and N-channel MOSFET is used for S3 and S4. It is noted that other implementation methods can also be used to achieve the same objective.

One objective of the resonant gate drive circuit shown in FIG. 14 is to charge and discharge capacitor Cg_Q1 and Cg_Q2 with minimum energy loss and as soon as possible. In real application, Cg_Q1 and Cg_Q2 are gate capacitors of MOSFETs. When the capacitor voltage is high, the MOSFET is turned on and when the capacitor voltage is low, the MOSFET is turned off.

Figure 15:
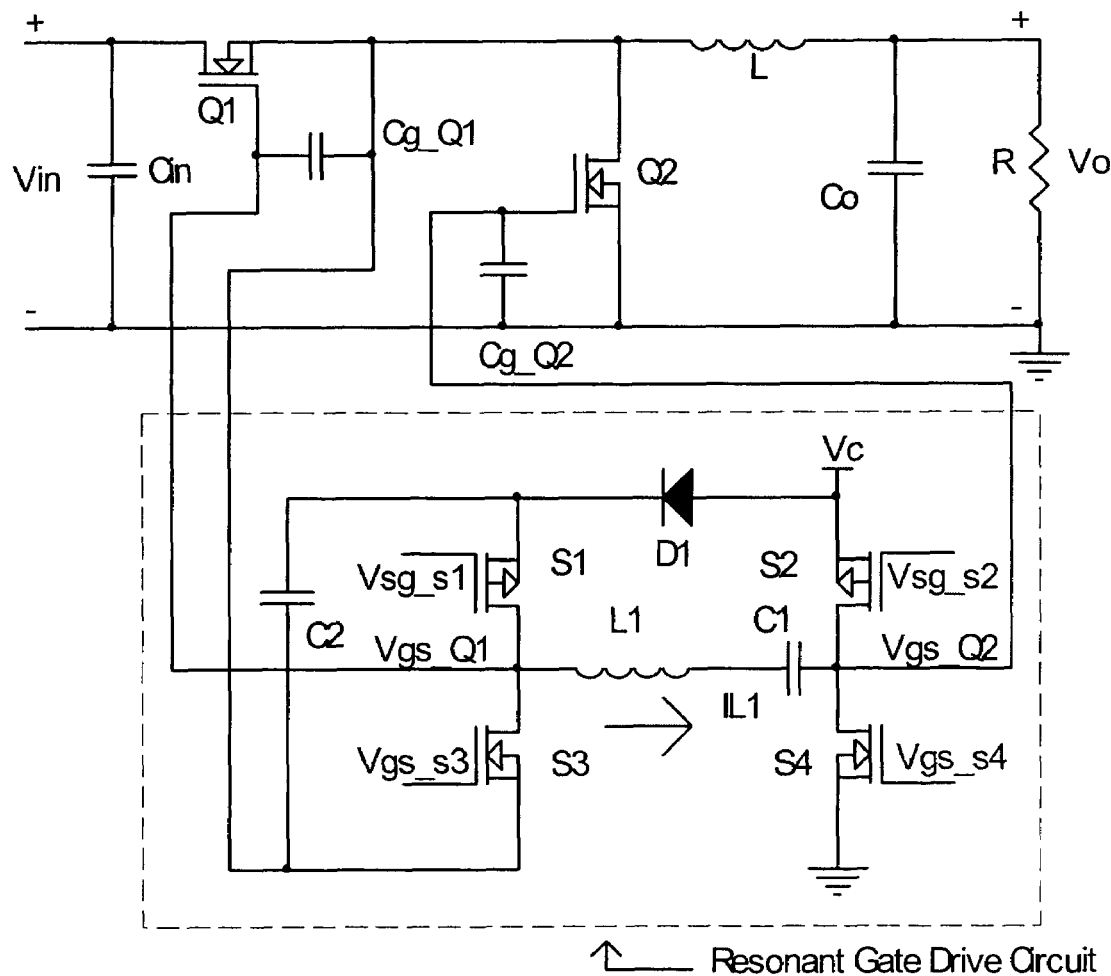
FIG. 15 is a circuit diagram of a Buck converter with a dual high side and low side complimentary resonant gate drive circuit.

FIG. 15 shows the circuit when dual high side and low side resonant gate drive circuit is used to drive the two MOSFETs in Buck converter. In the circuit, Q1 is control MOSFET and Q2 is synchronous drive MOSFET. Cg_Q1 and Cg_Q2 are gate capacitors for Q1 and Q2, respectively. The duty cycle for Q1 is D and the duty cycle for Q2 is 1−D.

With the resonant gate drive circuit, the energy stored in the gate of Q1 and Q2 is recovered. In addition, the turn on and turn off time of Q1 and Q2 are reduced as compared with the conventional gate drive circuit. The benefit is lower switching loss for Q1 and lower conduction loss for Q2. The efficiency of the Buck converter can be improved.

Figure 16:
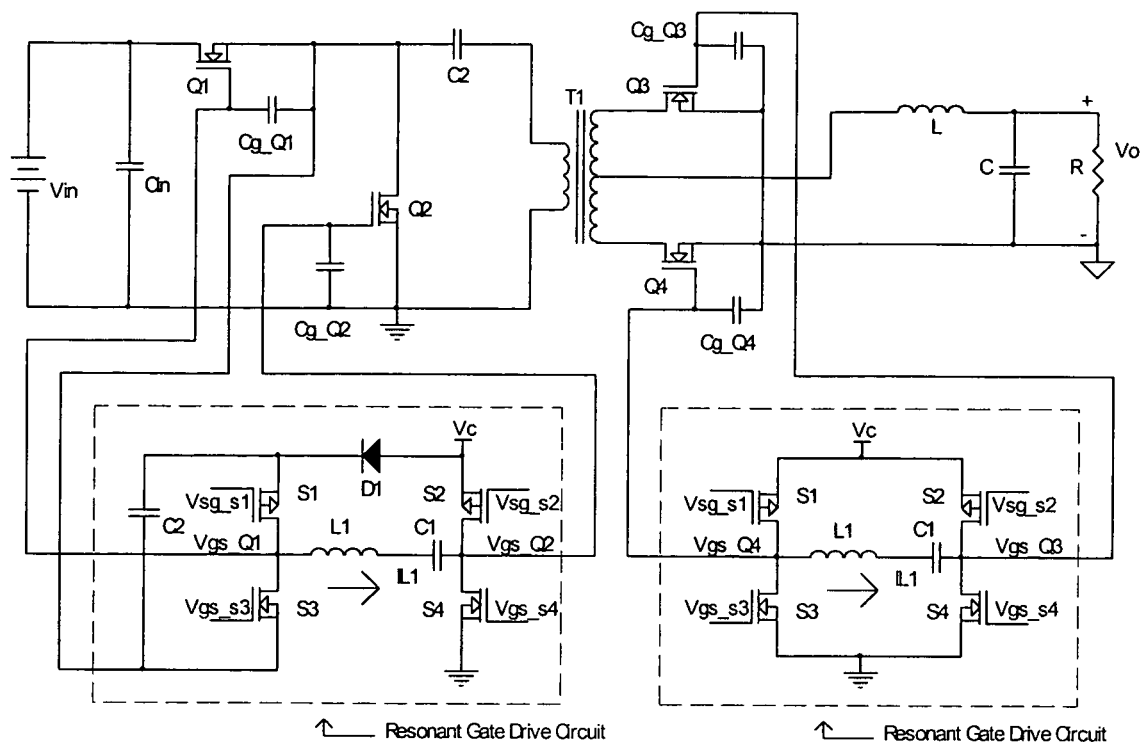
FIG. 16 is a circuit diagram of an asymmetrical half bridge converter with a dual high side and low side complimentary resonant gate drive circuit and a dual low side complimentary resonant gate drive circuit.

The dual high side and low side resonant gate drive circuit as shown in FIG. 14 can also be used in other circuit topology. FIG. 16 shows the asymmetrical half bridge converter with dual resonant gate drive circuit. At the primary side, the dual high side and low side complimentary resonant gate drive circuit is used and at the secondary side, the dual low side complimentary resonant gate drive circuit is used.

Figure 17:
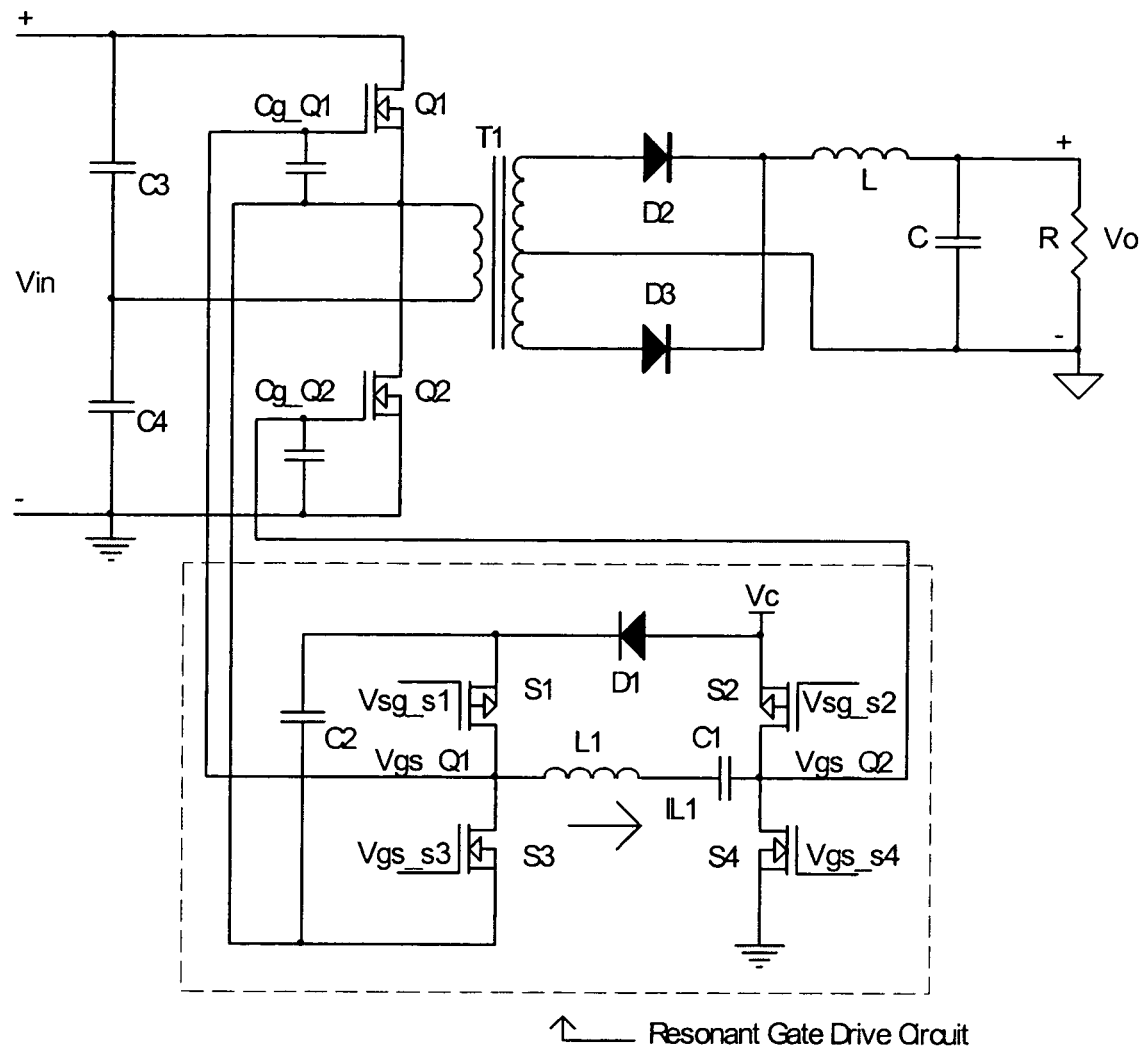
FIG. 17 is a circuit diagram of a half bridge converter with a dual high side and low side resonant gate drive circuit.
Figure 19:
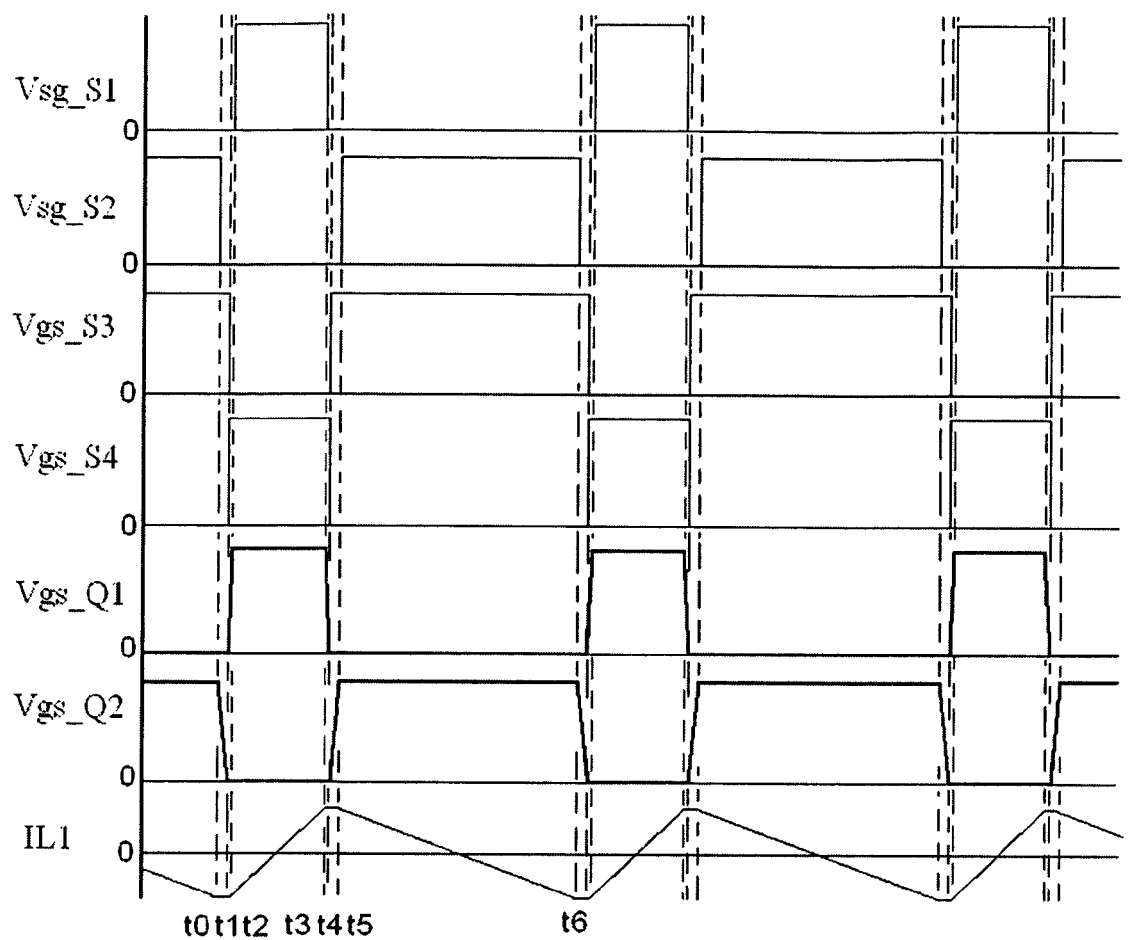
FIG. 19 shows the key waveforms of dual high side and low side resonant gate drive circuit with complementary signal operation.

In FIG. 15 and FIG. 16, the dual high side and low side resonant gate drive circuit generates a complimentary gate signal. It will generate D for Q1 and 1−D for Q2. The waveforms are shown in FIG. 19. It is noted that this circuit can also generate a symmetrical duty cycle for Q1 and Q2. FIG. 17 shows a half bridge converter with dual high side and low side resonant gate drive circuit.

Figure 20:
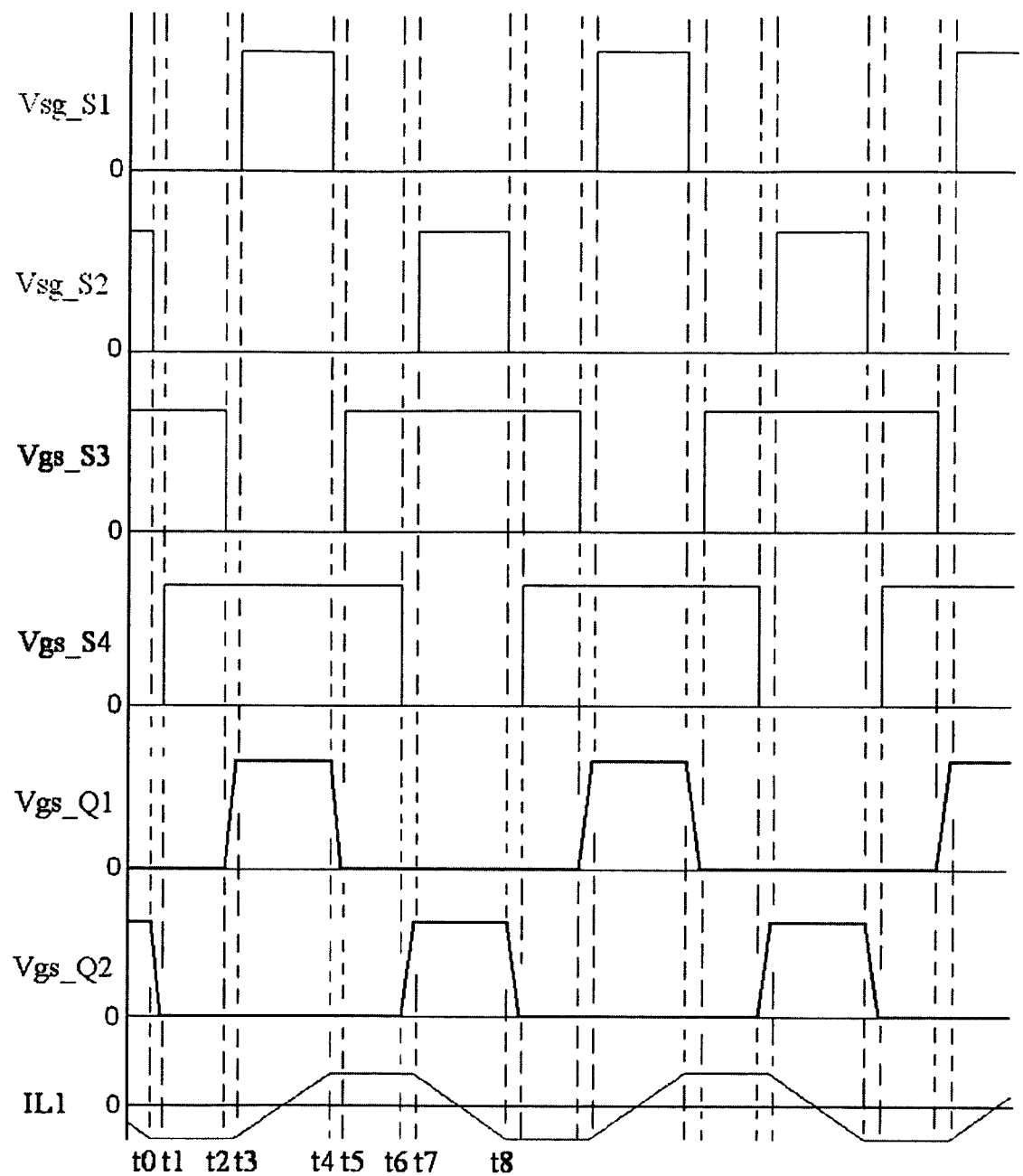
FIG. 20 shows the key waveforms of dual high side and low side resonant gate drive circuit with symmetrical signal operation.

In the above figure, Cg_Q1 and Cg_Q2 represent gate capacitors of MOSFET Q1 and Q2, respectively. The duty cycles for Q1 and Q2 are both D. The waveforms are shown in FIG. 20.

Figure 18:
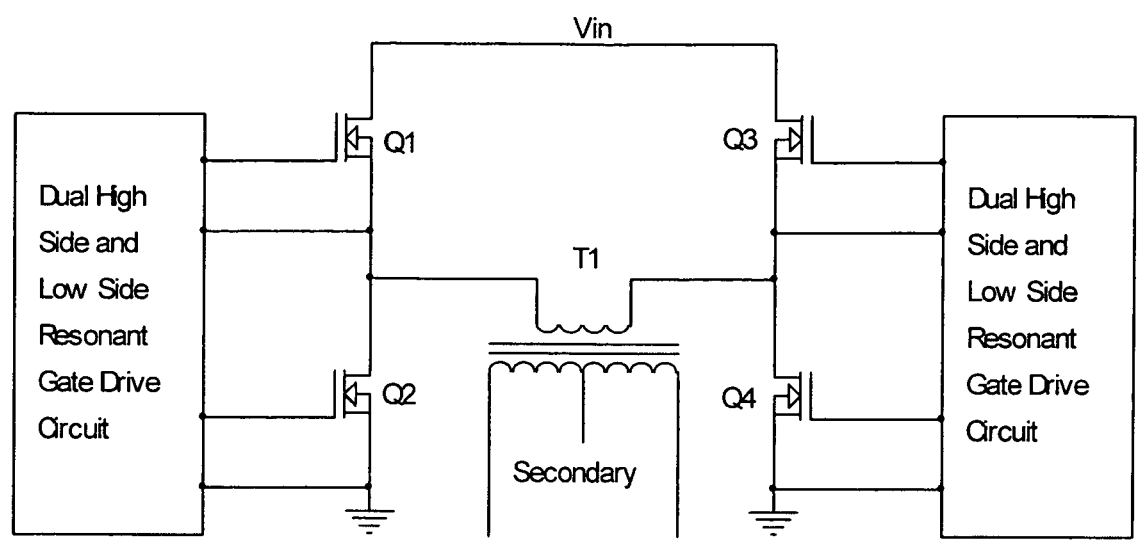
FIG. 18 is a circuit diagram of a full bridge converter with dual high side and low side resonant gate drive circuit.

FIG. 18 shows a full bridge converter with dual high side and low side symmetrical resonant gate drive circuit.

In the circuit, two dual high side and low side resonant gate drive circuits are used, one for the left side and one for the right side. Cg_Q1, Cg_Q2, Cg_Q3, and Cg_Q4 represent the gate capacitors of Q1, Q2, Q3, and Q4 respectively.

3.2 Operation for Complimentary Gate Drive Signal

The resonant gate drive circuit shown in FIG. 14 can operate in both complimentary and symmetrical mode. The operation for complimentary gate drive mode is discussed in this section and the operation for symmetrical gate drive mode is discussed in section 3.3.

The operation of the dual high side and low side complimentary resonant gate drive circuit, as shown in FIG. 14, can be analyzed by the key waveforms shown in FIG. 19. In the figure, Vsg_S1, Vsg_S2, Vgs_S3, and Vgs_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1. In the analysis, it is assumed that capacitor C1 is very large and the voltage across C1 is a DC value. If the capacitor value C1 is small, the operation of the circuit does not change. The capacitor value for C2 is very large and the voltage across C2 is a DC value.

The following provides the detailed operation of dual high side and low side resonant gate driver circuit operating at complimentary mode. The duty cycle for Q1 is D and duty cycle for Q2 is 1−D. Refer to the key waveforms in FIG. 19 and the circuit in FIG. 13.

Before t0:

S1, S4 are off and S2, S3 are on. Q1 is off and Q2 is on. The inductor current, IL1, increases to negative maximum value. The inductor current IL1 flows in the loop consisted of S2, C1, L1, S3, Q2 and Vc. The voltage across C2 is charged to the level of Vc via D1 and Q2.

From t0 to t1:

S2 is turned off at t0. Inductor L1 resonates with the input capacitor of MOSFET Q2, Cg_Q2. Cg_Q2 will be discharged at this period. The voltage across Cg_Q2 decreases and it will be clamped to zero by the body diode of S4 before t1. Q2 is turned off in this time interval. The current IL1 flows in the loop consisted of Cg_Q2, C1, L1, S3 and Q2. Then at t1, S3 is turned off and S4 is turned on with zero voltage simultaneously. By controlling the turn off instant for S2 (t0), the turn off instant of Q2 can be controlled.

From t1 to t2:

S3 is turned off and S4 is turned on with zero voltage at t1 simultaneously. Inductor L1 resonates with the input capacitor of MOSFET Q1, Cg_Q1. Cg_Q1 will be charged at this period. The voltage across Cg_Q1 increases and it will be clamped to the level of Vc by the body diode of S1 before t2. Q1 is turned on in this time interval. The current IL1 flows in the loop consisted of S4, C1, L1, Cg_Q1, Q1 and Vin after Q1 is turned on. Then at t2, S1 is turned on with zero voltage. By controlling the turn off instant for S3 (t1), the turn on instant for Q1 can be controlled.

From t2 to t3:

S1, S4 are on and S2, S3 are off. Q1 is on and Q2 is off. The negative inductor current IL1 rises to zero and further increases. The value of the current IL1 will increase to positive maximum at t3. The current IL1 flows in the loop consisted of C2, S1, L1, C1, S4, Vin and Q1. Then at t3, S1 is turned off with zero voltage.

From t3 to t4:

S1 is turned off at t3. Inductor L1 resonates with capacitor Cg_Q1. Cg_Q1 will be discharged at this period. The voltage across Cg_Q1 decreases and it will be clamped to zero by the body diode of S3 before t4. Q1 is turned off in this time interval. The current IL1 flows in the loop consisted of Cg_Q1, L1, C1, S4, Vin and Q1. At t4, S3 is turned on and S4 is turned off with zero voltage simultaneously. By controlling the turn off instant for S1 (t3), the turn off instant of Q1 can be controlled.

From t4 to t5:

S3 is turned on and S4 is turned off with zero voltage at t4 simultaneously. Inductor L1 resonates with capacitor Cg_Q2. Cg_Q2 will be charged at this period. The voltage across Cg_Q2 increases and it will be clamped to the source voltage Vc by the body diode of S2 before t5. Q2 is turned on in this time interval. The current IL1 flows in the loop consisted of S3, L1, C1, Cg_Q2, and Q2. At t5, S2 is turned on with zero voltage. By controlling the turn on instant for S3 (t4), the turn on instant for Q2 can be controlled.

From t5 to t6:

S1, S4 are off and S2, S3 are on, while Q1 is off and Q2 is on. The inductor current IL1 decreases to zero and then it will increase in opposite direction. The value of the current IL1 will increase to negative maximum at t6. The current IL1 flows in the loop consisted of S2, C1, L1, S3, Q2 and Vc. The next cycle will start at t6.

3.3 Operation for Symmetrical Gate Drive Signal

As discussed earlier, the dual high side and low side resonant gate drive circuit shown in FIG. 14 can also operate in symmetrical duty cycle mode. Such converters as half bridge converters and full bridge converters require this operation mode.

The symmetrical signal operation can be analyzed by the key waveforms shown in FIG. 20. In the figure, Vsg_S1, Vsg_S2, Vsg_S3, and Vsg_S4 are gate drive signals for S1-S4. Vgs_Q1 and Vgs_Q2 are the voltage across Cg_Q1 and Cg_Q2. The rising edge and falling edge of Vgs_Q1 and Vgs_Q2 are shown to illustrate the details of charging and discharging interval. IL1 is the current waveform through inductor L1. In the analysis, it is assumed that capacitor C1 is very large and the voltage across C1 is a DC value. If the capacitor value C1 is small, the operation of the circuit does not change. The capacitor value for C2 is very large and the voltage across C2 is a DC value.

The following provides the detailed operation of dual high side and low side resonant gate driver circuit operating at symmetrical mode. The duty cycles for Q1 and Q2 are both D, with half switching period shift between each other. Refer to the key waveforms in FIG. 20 and the circuit in FIG. 14.

Before t0:

S2, S3 are on and S1, S4 are off. Q1 is off and Q2 is on. The inductor current reaches negative maximum at t0. The inductor current, IL1, flows through S2, C1, L1, S3, Q2, and Vc. The voltage across C2 is charged to the level of Vc via D1 and Q2.

From t0 to t1:

S2 is turned off at t0 with zero voltage. Inductor L1 resonates with the input capacitor of Q2, Cg_Q2. Cg_Q2 will be discharged at this period. The voltage across Cg_Q2 decreases and it will be clamped to zero by the body diode of S4 before t1. Q2 is turned off in this time interval. The current IL1 flows through Cg_Q2, C1, L1, S3 and Q2. At t1, S4 is turned on with zero voltage. By controlling the turn off instant for S2 (t0), the turn off instant for Q2 can be controlled.

From t1 to t2:

S3, S4 are on and S1, S2 are off. Both Q1 and Q2 are off. The inductor current IL1 keeps constant in this interval. The current IL1 flows through S4, C1, L1, S3, the primary winding of the transformer, C3, C4 and Vin.

From t2 to t3:

S3 is turned off at t2 with zero voltage. Inductor L1 resonates with the input capacitor of Q1, Cg_Q1. Cg_Q1 will be charged at this period. The voltage across Cg_Q1 increases and it will be clamped to the level of Vc by the body diode of S1 before t3. Q1 is turned on in this time interval. The current IL1 flows through S4, C1, L1, Cg_Q1, Q1 and Vin after Q1 is turned on. At t3, S1 is turned on with zero voltage. By controlling the turn off instant for S3 (t2), the turn on instant for Q1 can be controlled.

From t3 to t4:

S1, S4 are on and S2, S3 are off. Q1 is on and Q2 is off. The inductor current increases from the negative maximum, through zero point and reaches positive maximum at t4. The current IL1 flows through S4, C1, L1, S1, C2, Q1 and Vin.

From t4 to t5:

S1 is turned off at t4 with zero voltage. Inductor L1 resonates with Cg_Q1. Cg_Q1 will be discharged at this period. The voltage across Cg_Q1 decreases and it will be clamped to zero by the body diode of S3 before t5. Q1 is turned off in this time interval. The current IL1 flows through Cg_Q1, L1, C1, S4, the primary winding of the transformer, C3, C4 and Vin after Q1 is turned off. At t5, S3 is turned on with zero voltage. By controlling the turn off instant for S1 (t4), the turn off instant of Q1 can be controlled.

From t5 to t6:

S3, S4 are on and S1, S2 are off. Both Q1 and Q2 are off. The inductor current IL1 is constant in this interval. The current IL1 flows through S3, L1, C1, S4, Vin, C3, C4 and the primary winding of the transformer.

From t6 to t7:

S4 is turned off at t6 with zero voltage. Inductor L1 resonates with Cg_Q2. Cg_Q2 will be charged at this period. The voltage across Cg_Q2 increases and it will be clamped to the source voltage Vc by the body diode of S2 before t7. Q2 is turned on in this time interval. The current IL1 flows through S3, L1, C1, Cg_Q2 and Q2 after Q2 is turned on. Then at t7, S2 is turned on with zero voltage. By controlling the turn off instant for S4 (t6), the turn on instant of Q2 can be controlled.

From t7 to t8:

S2, S3 are on and S1, S4 are off. Q1 is off and Q2 is on. The inductor current IL1 decreases to zero and it will increase to negative maximum at t8. The current IL1 flows through S2, C1, L1, S3, Q2 and Vc. The next cycle will start at t8.

We claim:

1. A method of controlling operation of first and second power switching devices having gate capacitors, comprising:

charging the gate capacitors of the first and second power switching devices at a high current level;

connecting the gate capacitors of the first and second power switching devices to a voltage source, via a first low impedance path, while the first and second power switching devices are on;

discharging the gate capacitors of the first and second power switching devices at a high current level; and maintaining the voltage across the gate capacitors of the first and second power switching devices at a low voltage via a second low impedance path while the first and second power switching devices are off;

so as to reduce energy loss for charging and discharging the gate capacitors of the first and second power switching devices and to reduce switching loss of the first and second power switching devices;

wherein the gate capacitors are directly between a gate and a source, an emitter, or a cathode of the first and second power switching devices and are part of the power switching devices;

wherein the charging, connecting, and discharging are performed on the gate capacitors of the first and second power switching devices at different times;

wherein an inductor is directly connected between the gate capacitors of the first and second power switching devices; and wherein the first and second power switching devices are selected from MOSFET, IGBT and MCT.

2. The method of claim 1 wherein the first and second power switching devices are MOSFETs.

3. The method of claim 1 wherein at least one of the first and second power switching devices comprises a plurality of power switching devices in parallel.

4. The method of claim 1 wherein said high current is a substantially constant current.

5. The method of claim 1 wherein said high current is a substantially constant current plus a fluctuant current.

6. The method of claim 1 wherein one terminal of each of the first and second power switching devices is connected to a common voltage.

7. The method of claim 1 wherein one terminal of the first power switching device is connected to a common voltage and the second power switching device is not connected to the common voltage.

8. The method of claim 6 wherein the common voltage is ground of the circuit.

9. The method of claim 1 wherein said low voltage is lower than a voltage to maintain said power switching device in an off-state.

10. A resonant gate drive circuit comprising:
a current switching circuit comprising an alternating current source; and
first and second power switching devices having gate capacitors connected to said switching circuit so as to connect said current source to said gate capacitors and to charge and discharge said gate capacitors at selected time instants;
wherein energy loss for charging and discharging the gate capacitors of the power switching devices is reduced and switching loss of the power switching devices is reduced;
wherein the gate capacitors are directly between a gate and a source, an emitter, or a cathode of the power switching devices and are part of the power switching devices;
wherein the alternating current source is an inductor directly connected between the gate capacitors of the first and second power switching devices; and wherein the first and second power switching devices are selected from MOSFET, IGBT and MCT.

11. The resonant gate drive circuit of claim 10 wherein said current source includes a capacitor connected in series with the inductor.

12. The resonant gate drive circuit of claim 10 wherein said current switching circuit comprises a plurality of switches for directing the flow of said current to charge and discharge the gate capacitors.

13. The resonant gate drive circuit of claim 10 wherein said current switching circuit clamps gate capacitor voltage at about zero volts or at about the voltage of a voltage source.

14. The resonant gate drive circuit of claim 13 wherein the current switching circuit comprises switches, capacitors and at least one diode.

15. The resonant gate drive circuit of claim 12 wherein said switches are MOSFETs.

16. The resonant gate drive circuit of claim 12 wherein said switches are bipolar junction transistors with anti-parallel diodes.

17. The resonant gate drive circuit of claim 13 wherein said current switching circuit comprises of plurality of switches and at least one capacitor.

18. A resonant gate drive circuit for use with a power source having a positive terminal and a negative terminal, comprising:
an inductor having a first terminal and a second terminal;
a first terminal of a first switch connected to a first terminal of a second switch and to said positive terminal of said power source;
a second terminal of said first switch connected to a first terminal of a third switch and to said first terminal of said inductor;
a second terminal of said second switch connected to a first terminal of a fourth switch and to said second terminal of said inductor;
a second terminal of said third switch connected to a second terminal of said fourth switch and to said negative terminal of said power source;
a gate capacitor of a first power switching device connected between the first terminal of the inductor and the negative terminal; and
a gate capacitor of a second power switching device connected between the second terminal of the inductor and the negative terminal;
wherein the first and second power switching devices are selected from MOSFET, IGBT and MCT.

19. The resonant gate drive circuit of claim 18 including a capacitor connected in series with said inductor.

20. The resonant gate drive circuit of claim 18 wherein at least one of said power switching devices comprises a plurality of power switching devices in parallel.

21. The resonant gate drive circuit of claim 18 wherein said first to fourth switches are controllable bidirectional conducting devices.

22. The resonant gate drive circuit of claim 21 wherein the controllable bidirectional conducting devices are MOSFETs.

23. The resonant gate drive circuit of claim 21 wherein the controllable bidirectional conducting devices are BJTs with an anti-parallel diodes.

24. The resonant gate drive circuit of claim 18 wherein the power switching devices are MOSFETs.

25. A resonant gate drive circuit for use with a power source having a positive terminal and a negative terminal, comprising:
an inductor having a first terminal and a second terminal;
a first capacitor having a first terminal and a second terminal;
a second capacitor having a first terminal and a second terminal;
a unidirectional conducting device having an anode terminal and a cathode terminal;
a first terminal of a first switch being connected to said cathode terminal of said unidirectional conducting device and to said first terminal of said second capacitor;
a first terminal of a second switch being connected to said positive terminal of said power source and to said anode terminal of said unidirectional conducting device;
a first terminal of a third switch being connected to a second terminal of said first switch and to said first terminal of said inductor;
a first terminal of a fourth switch being connected to a second terminal of said second switch and to said second terminal of said first capacitor;
a second terminal of said third switch being connected to said second terminal of said second capacitor;
a second terminal of said fourth switch being connected to said negative terminal of said power source;
the said second terminal of said inductor being connected to said first terminal of said first capacitor;
a gate capacitor of a fifth switch being connected in parallel with said third switch; and
a gate capacitor of a sixth switch being connected in parallel with said fourth switch.

26. The resonant gate drive circuit of claim 25 wherein said fifth and sixth switches are power switching devices.

27. The resonant gate drive circuit of claim 26 wherein at least one of said power switching devices comprises a plurality of power switching devices in parallel.

28. The resonant gate drive circuit of claim 25 including means to generate a floating voltage for driving at least one of said gate capacitors of said fifth and sixth switches.

29. The resonant gate drive circuit of claim 20 wherein the means to generate said floating voltage comprises said unidirectional conducting device and said second capacitor.

30. The resonant gate drive circuit of claim 25 wherein the unidirectional conducting device is a diode.

31. The resonant gate drive circuit of claim 25 wherein at least one of said first to fourth switches is a controllable bidirectional conducting device.

32. The resonant gate drive circuit of claim 31 wherein said controllable bidirectional conducting device is a MOSFET.

33. The resonant gate drive circuit of claim 31 wherein said controllable bidirectional conducting device is a BJT with an anti-parallel diode.

34. The resonant gate drive circuit of claim 26 wherein said power switching devices are selected from MOSFET, IGBT and MCT.

35. The resonant gate drive circuit of claim 26 wherein said power switching devices are MOSFETs.

36. The method of claim 1 wherein the power switching devices are IGBTs.

37. The method of claim 1 wherein the power switching devices are MCTs.

38. The resonant gate drive circuit of claim 10 wherein said power switching devices are MOSFETs.

39. The resonant gate drive circuit of claim 10 wherein said power switching devices are IGBTs.

40. The resonant gate drive circuit of claim 10 wherein said power switching devices are MCTs.

41. The resonant gate drive circuit of claim 10 wherein at least one of said power switching devices comprises a plurality of power switching devices in parallel.

42. The method of claim 1 including a capacitor connected in series with the inductor.

43. The resonant gate drive circuit of claim 18 wherein the power switching devices are IGBTs.

44. The resonant gate drive circuit of claim 18 wherein the power switching devices are MCTs.

45. The resonant gate drive circuit of claim 26 wherein the power switching devices are IGBTs.

46. The resonant gate drive circuit of claim 26 wherein the power switching devices are MCTs.

* * * * *

UNITED STATES PATENT AND TRADEMARK OFFICE
CERTIFICATE OF CORRECTION

PATENT NO. : 7,612,602 B2
APPLICATION NO. : 11/045055
DATED : November 3, 2009
INVENTOR(S) : Zhihua Yang and Yan-Fei Liu Page 1 of 1

It is certified that error appears in the above-identified patent and that said Letters Patent is hereby corrected as shown below:

Column 14, Claim 29, Line 58, replace "claim 20" with --claim 28--.

Signed and Sealed this
Tenth Day of April, 2012

David J. Kappos
*Director of the United States Patent and Trademark Office*